(12) United States Patent
Cole

(10) Patent No.: US 6,803,071 B1
(45) Date of Patent: Oct. 12, 2004

(54) PARAELECTRIC THIN FILM SEMICONDUCTOR MATERIAL AND METHOD FOR PRODUCING THE SAME

(75) Inventor: Melanie W. Cole, Churchville, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 10/339,622

(22) Filed: Jan. 10, 2003

(51) Int. Cl.⁷ ............ C23C 16/00; C30B 25/02; C30B 25/04
(52) U.S. Cl. ............ 427/126.3; 117/89; 117/93; 117/103
(58) Field of Search ............ 117/84, 89, 93, 117/103; 427/126.3

(56) References Cited

U.S. PATENT DOCUMENTS

| | | | |
|---|---|---|---|
| 5,753,300 A | * 5/1998 | Wessels et al. | 427/126.3 |
| 6,208,453 B1 | * 3/2001 | Wessels et al. | 359/321 |
| 6,362,068 B1 | * 3/2002 | Summerfelt et al. | 438/396 |
| 6,437,371 B2 | * 8/2002 | Lipkin et al. | 257/77 |

* cited by examiner

*Primary Examiner*—Felisa Hiteshew
(74) *Attorney, Agent, or Firm*—William V. Adams

(57) ABSTRACT

A method of deposition of a microwave frequency paraelectric BST-based thin film on a SiC substrate provides a resulting thin film-substrate structure which has no interfacial phases or element/chemical interdiffusion. For physical vapor deposition of the thin film, at least one of (i) thermally stable, refractory semiconductor substrate material is heat-treated during film deposition and (ii) the film-substrate structure is post-deposition heat treated, e.g., annealed, to achieve high quality film crystallinity with a fully developed film microstructure having desired microwave dielectric and insulating properties. For chemical solution deposition, the thin film is deposited onto a thermally stable, refractory semiconductor substrate material and is post-deposition heat treated to achieve a high quality film with a fully developed film microstructure having desired microwave dielectric and insulating properties.

14 Claims, 2 Drawing Sheets

PARAELECTRIC THIN FILM SEMICONDUCTOR MATERIAL AND METHOD FOR PRODUCING THE SAME

BACKGROUND OF THE INVENTION

1. Field of the Invention

This invention relates to thin film materials, such as paraelectric $Ba_{1-x}Sr_xTiO_3$ (BST) based thin films, and methods for producing such materials.

2. Discussion of the Related Art

Thin films of dielectric materials (ferroelectric and paraelectric materials) have applications in a variety of microelectronic devices. Ferroelectric and paraelectric materials, such as barium strontium titanate, $Ba_{1-x}Sr_xTiO_3$ (BST), $Pb(Zr,Ti)O_3$ (PZT), $SrTiO_3$ (STO), SBT ($SrBi_2Ta_2O_9$), and tantalum oxide ($Ta_2O_5$), thin films are commonly used in memory devices, such as ultra large scale integrated DRAMs/FRAMs, dielectric capacitors, electro-optic, piezoelectric and pyroelectric devices. Additionally, such films are suitable for applications in a large family of tunable and electronically controllable microwave devices. Such devices include voltage tunable phase shifters, capacitors, oscillators, filters, delay lines, resonators, and parametric amplifiers.

In particular, the thin film technology, such as a BST-based film, allows high frequency device operation (about 1 to about 100 GHz) with minimum power consumption (e.g., less than about 10 volts), low noise, integration compatibility with other semiconductor microwave devices. BST-based thin film technology additionally permits realization of compact, light weight, integratable, conformable, and tunable microwave devices to be realized.

However, because conventional BST film processing techniques include treatment temperatures often greater than about 700° C., interdiffusion is caused at the interface of the film and the substrate. Such interdiffusion results in undesirable interfacial phases that alter the dielectric properties of the film. As the film becomes multi-phased, the dielectric properties of the ferroelectric film degrade due to the addition of one or more non-ferroelectric phases. In microwave applications, this translates to an undesirable power loss in the device. Such elevated temperatures are often generated during deposition of the film upon the substrate, post-depositing annealing and in situ deposition substrate heating. If paraelectric BST-based thin film technology is to be efficiently integrated with other microwave components, this processing temperature must be lowered because at conventional treating temperatures, e.g., generally greater than about 700° C., the above-described interdiffusion occurs between the film and the semiconductor substrate.

Conventional BST-based thin films deposited onto a semiconductor substrate are traditionally processed at temperatures in excess of 750 ° C. As a result, the paraelectric BST-based thin film-substrate interface is subjected to high temperature heat treatment, for example up to about 1200° C. Thus, a structurally and chemically abrupt film-substrate interface is created, however interfacial phase formation results due to film-substrate elemental or chemical diffusion.

Techniques have been developed to eliminate the interfacial phases including (1) low temperature annealing ($T_A$) or lower substrate temperatures ($T_S$) during film deposition;

(2) using refractory ceramic substrates, such as, MgO, $LaAlO_3$, $SrTiO_3$, sapphire, and glass;

(3) using thermally stable microwave friendly barrier layers sandwiched between the semiconductor substrate and the BST-based thin film; and (4) low-temperature deposition techniques such as thermal metalorganic chemical vapor deposition (MOCVD).

Lowering of $T_A$ or $T_s$ is counter productive because the dielectric, insulating, and tunability properties, as well as the reliability of paraelectric thin film materials, are strongly influenced by film crystallinity, film stress, quality of the film-substrate interface, and the film microstructure, each of which are a function of $T_A$ and $T_S$. Adequate post-deposition annealing or in situ substrate heating is required to impart crystallinity, increase the overall grain size of the film, and to remove film strain by filling oxygen vacancies. These factors are particularly important since microwave dielectric loss in BST-based thin films is strongly influenced by stoichiometric deficiencies, which create vacancies, film strain, and the presence of a large grain boundary to grain ratio. Therefore, in order to reduce the microwave dielectric loss, the BST-based films must be fully crystallized or developed. However, a fully crystallized or developed thin film with optimal dielectric and insulating properties cannot be achieved by simply lowering the processing temperatures ($T_A$ and/or $T_S$).

The technique of using a refractory ceramic substrate allows the film dielectric properties to be optimized via high temperature processing. However, these film-ceramic substrate structures are not directly integratable with semiconductor components or devices, that is, non-semiconductor substrates offer incompatibility with other semiconductor-based devices, posing integration issues. These film-ceramic substrate structures are essentially discrete components and are not directly integratable with other microwave semiconductor-based microwave devices via traditional direct growth and deposition techniques. The use of microwave friendly barrier layers, such as single and binary oxides and superconductors, permits the use of low cost non-microwave friendly Si substrates and higher processing temperatures. However, barrier layers add extra processing steps to the device fabrication process. Additional processing steps are undesirable from the device fabrication, yield, reliability and cost perspectives.

Thin films of, for example, BST-based materials, on MgO substrates have been achieved at temperatures as low as 600° C. via thermal metalorganic chemical vapor deposition (MOCVD). The processing temperature for the MOCVD technique is 200° C. lower than for other BST film deposition techniques. However the MOCVD growth method has difficulty maintaining film stoichiometry due to reaction of the precursor elements in the vapor phase prior to deposition on the substrate. Precise stoichiometric control of the film is necessary to obtain the film composition influenced dielectric and insulating properties.

SUMMARY OF THE INVENTION

The invention relates to a method for producing paraelectric thin film materials which avoids undesirable film-substrate interdiffusion and formation of undesirable interfacial phases, while providing high quality film crystallinity and a fully developed thin film microstructure, required to achieve the desired microwave frequency dielectric and insulating properties. Specifically, deposition of a ferroelectric film on a SiC substrate obviates interfacial phase formation. This result is achieved even with treatment temperatures greater than 700° C., which temperatures are necessary to fully crystallize and develop the film. This method achieves the result even with temperatures greater than 800° C.

Because the material resulting from the method of the invention utilizes semiconductor substrates, the material may be directly integrated with other semiconductor components, such as those used in microwave devices.

The present invention includes deposition of a paraelectric film on a refractory, high temperature, and thermally stable semiconductor substrate, comprising for example, silicon carbide (SiC). SiC is a semiconductor material used for high temperature, high power and high frequency device applications. It is believed that the large bond energy of SiC is the cause of its thermal stability at high temperatures, and this thermal stability at high temperatures impedes the thermal processing related interdiffusion and undesirable interface phase formation between the paraelectric thin film and the substrate. The paraelectric film may be, for example, a BST-based film.

The method of the invention preferably uses physical vapor deposition (PVD) methods, such as pulsed laser deposition (PLD) and sputter deposition methods. Alternatively, the method of the present invention can employ chemical deposition methods such as metalorganic solution deposition (MOSD), dip coating, and chemical vapor deposition (CVD) techniques.

For PVD deposition of paraelectric films, such as BST-based films, the substrate may be heated to temperatures ($T_S$), typically greater than about 750° C., sufficient to achieve the fully crystallized film required to obtain the optimized microwave dielectric and insulating properties. Since the SiC substrate is a strongly bonded, high temperature material, there is no formation of undesirable film-substrate interfacial phases at the interface of the BST-based film and the SiC substrate after thermal treatment. The same is true for deposition techniques that require a post-deposition high temperature annealing treatment (generally in the range of about 700° C. to 1100° C.), such as the metalorganic solution deposition.

Operation under velocity saturation conditions permits high DC and RF currents to develop and permits efficient RF operation throughout the microwave frequency region. The high breakdown voltage of SiC permits high drain bias voltages to be applied, which are necessary to obtain high RF output power. Theoretical analysis predicts that SiC devices have a microwave power capability at room temperature that is approximately a factor of four greater than comparable devices fabricated from GaAs or Si.

The integration of paraelectric BST-based thin film with SiC substrates and epilayers is not only important for providing thermal stability between the BST-based film and SiC substrate at high processing temperatures, but is also of desirable for the integration of voltage tunable low cost, BST-based thin films with other SiC based microwave devices. Such applications include microwave power amplifiers that can be used, for example, in phased array radars, base station transmitters for mobile communications, and high efficiency and broadband radar transmitters. Thus, if the power circuitry of radar and communications systems is SiC based, then a paraelectric thin film phase shifter material deposited on a SiC substrate simplifies component integration issues.

Due to its wide bandgap (which permits operation at elevated temperatures), high bond strength (excellent thermal stability), high thermal conductivity (which permits higher power density), high electric field strength (large breakdown field which permits higher operating voltage), and its high electron saturation velocity (which permits high operating current), SiC is desirable for high temperature, high power and high frequency (microwave) device applications. SiC is well suited for microwave devices because of its low dielectric constant (4H—SiC=10.0), low dielectric loss (<1.0%), high thermal conductivity (4.0 W/° K-cm), high saturation velocity ($2.0 \times 10^7$ cm/s), and large breakdown field strength ($3.5 \times 10^6$ V/cm). Specifically, the low dielectric constant produces reduced device impedances. Thus, the same device impedance, a larger device area can be used which in turn permits high RF power levels to be developed. The DC and RF device performance of high power microwave devices depends upon the ability to extract heat due to dissipated power. Hence, a high thermal conductivity is desirable. The DC and RF currents that flow through a microwave device are directly dependent on the charge carrier velocity versus electric field transport characteristics of a semiconductor material, and therefore a high saturation velocity is desirable. The magnitude of the electric field that produces saturated charge velocity is also important because the device must be able to develop the saturation field to obtain maximum RF performance and high frequency operation. The saturation fields for 4H and 6H SiC are $E_s \sim 60$ kV/cm and $E_s \sim 200$ kV/cm, respectively.

DETAILED DESCRIPTION OF THE INVENTION

Figure 1:
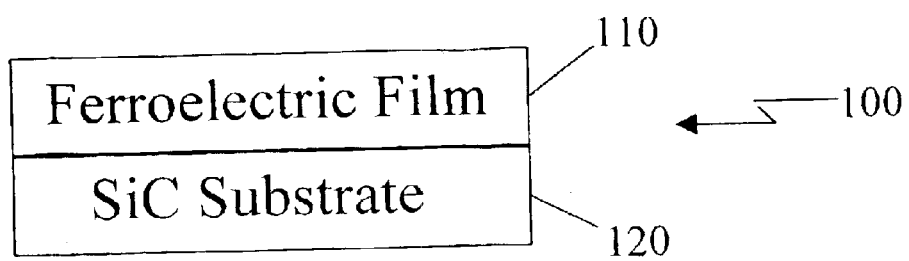
FIG. 1 illustrates a paraelectric BST-based thin film material according to the present invention.

FIG. 1 shows a paraelectric-thin film material 100 according to the invention. Specifically, a layer of, for example, BST-based film 110 is deposited on a surface of a SiC substrate 120. Due to the selection of SiC as the material for the substrate 120, interfacial phases at the interface between the film 110 and the substrate 120 are avoided or eliminated.

The present invention employs (1) a physical vapor deposition (PVD) technique of pulsed laser deposition (PLD), or (2) a metalorganic solution deposition (MOSD) technique, for deposition and growth of the paraelectric thin film on a SiC substrate. Preferably, the film is a BST-based film.

Figure 2:
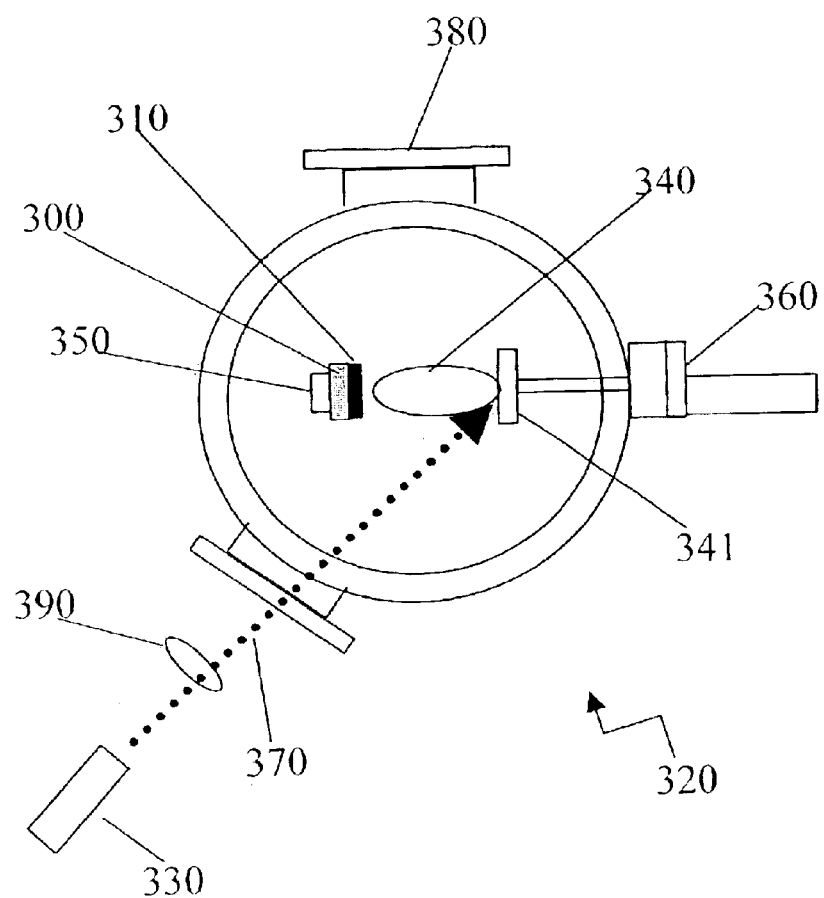
FIG. 2 illustrates an embodiment of a pulsed laser deposition (PLD) configuration to implement the method of the present invention.
Figure 3:
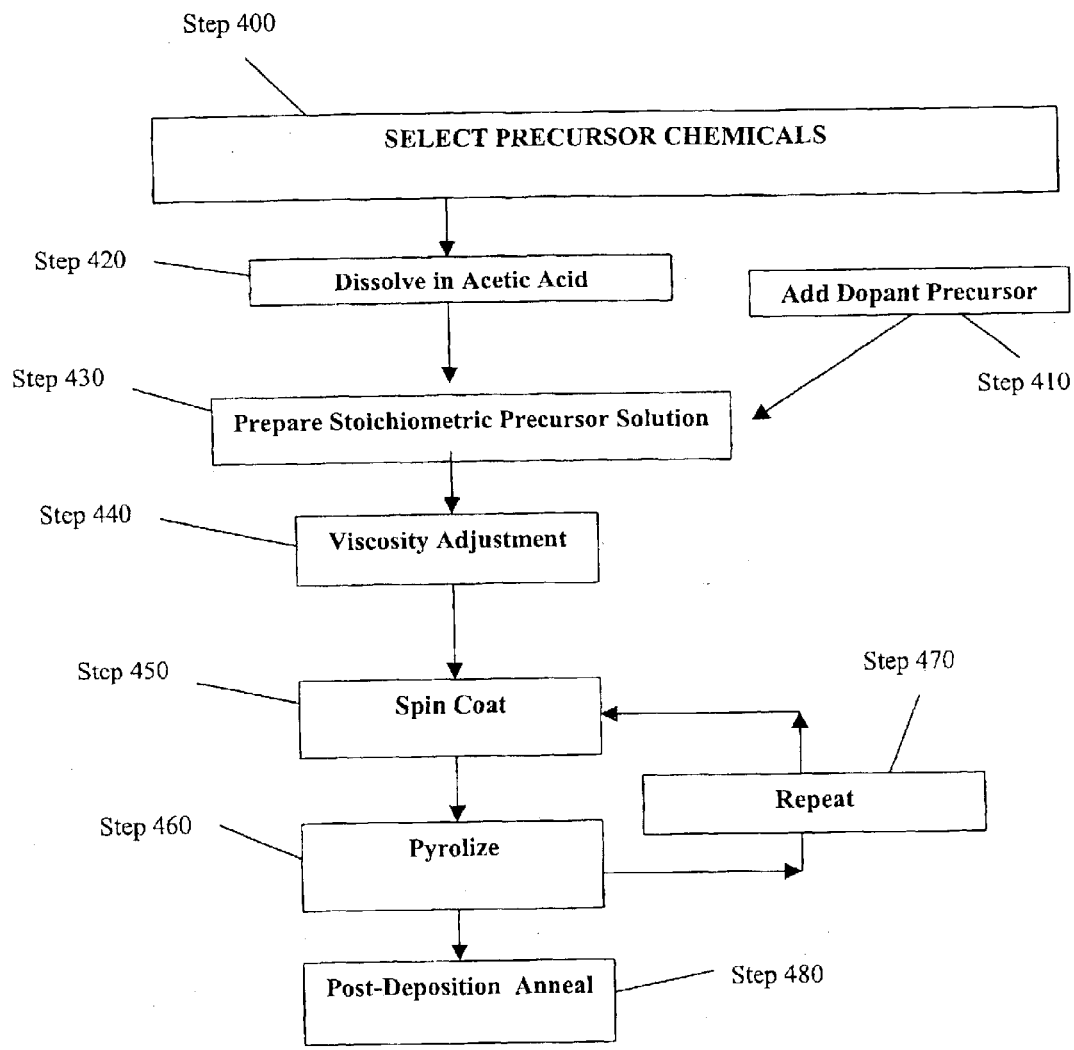
FIG. 3 illustrates a process flowchart of a metalorganic solution deposition technique (MOSD) configuration to implement the method of the present invention.

A chamber 320 for performing the PLD in accordance with the invention is shown in FIG. 2. A thermally stable, refractory substrate 300, preferably SiC, is heated to a temperature sufficient to achieve a desired crystallinity of the to-be-deposited and condensed paraelectric thin film 310 (which may be BST-based). Then, a paraelectric target 341, corresponding to the desired composition of the film 310, is laser ablated to create a vapor 340 in the vacuum environment of a PLD chamber 320. The resultant vapor 340 is condensed as thin film 310 on the thermally stable heated substrate 300.

The Pulsed Laser Deposition (PLD) chamber 320 preferably has a tunable oxygen partial pressure between 150 mT and 50 mT and a tunable laser 330 having a beam 370 is aimed at a target 341 within the PLD chamber 320. The laser 330 is preferably an excimer laser having a KrF-248 nm beam and 1–2 J/cm² and 1–10 Hz and an average pulse energy of 300 mJ with a 20 ns pulse width. The thermally stable, refractory semiconductor substrate 300, preferably single crystal 4H—SiC, is placed within the PLD chamber 320 on a sample holder 350. The substrate 300 is heated to a temperature greater than or equal to 700° C. The target 341 of paraelectric material, which may include doped or undoped BST, is placed upon a continuously rotating bolder 360, such that the surface of the substrate 300 is parallel to the target 341. Preferably, the separation distance between the target 341 and the substrate 300 is at least about 5 to 10 cm.

Once the chamber 320 is tuned to the desired oxygen partial pressure, the laser bean 370 is aimed at the rotating target 341 with a 45° incident angle. The laser 330 is energized as the beam 370 is focused on the target 341 through a focusing lens 390 to ablate the paraelectric target 341 for a tunable duration. This duration is determined by the desired thickness of the thin film being deposited 310.

Optionally, prior to starting the deposition process, the deposition rate can be calibrated to the laser parameters used by developing a plot of deposition rate (Å/sec) versus target ablation time.

Further, if the deposition is performed without heating the substrate, at a substrate heated temperature less than the temperature required for obtaining a fully crystallized film, a post-deposition treatment, such as annealing, must be performed in order to impart full crystallinity and produce a fully developed film microstructure to the deposited film.

For the metalorganic-solution deposition (MOSD) technique, the paraelectric thin films (which may be BST-based) may be prepared using carboxoxylate-alkoxide precursors spin coated on a thermally stable, refractory substrate. A post-deposition anneal is conducted at a high enough temperature to achieve a desired crystallinity of the to-be deposited paraelectric thin film.

A method for conducting the MSOD technique is shown as FIG. 2. Precursor chemicals are selected (Step 400) to produce the paraelectric thin film. Preferred chemicals include barium acetate, strontium acetate, and titanium isopropoxide. If a dopant is desired, a dopant precursor, such as magnesium methoxide, may be included in Step 410. The precursor chemicals may each be initially dissolved in glacial acetic acid (Step 420) and the resulting clear solutions be added to a solution of titanium iospropoxide in 2-methoxyethanol to form a stoichiometric, clear stable precursor solution (Step 430). Optionally, the dopant precursor is mixed with 2-methoxyethanol to form a separate clear stable solution, for example, a magnesium methoxide 2-methoxyethanol solution may be added to the precursor solution to prepare the stoichiometric precursor solution in Step 440 (e.g., (1-y)BST-yMgO). The 2-methoxyethanol content can be varied in Step 430 to control the viscosity of the solution, as particulates are removed from the solution by filtering through 0.2 µm syringe filters.

The precursor films, dispensed via a filter-syringe apparatus, are spin coated onto a thermally stable, refractory semiconductor substrate (Step 450), preferably the substrate is a single crystal 4H—SiC. The spin coating is typically conducted at a rate in the range of 4000 to 6000 revolutions per minute (rpm) for about 30 to about 120 seconds at room temperature. After each spin coated layer is formed, the film-substrate structures are pyrolysed on a hot plate at 350° C. (Step 460) in air for 10 min (this step is performed to ensure complete removal of volatile matter). The spin coat and pyrolyzation steps 450 and 460, respectively, are repeated until the desired film thickness is achieved (Step 470). The thickness of the spin coated film deposited is calibrated prior to deposition by developing a plot of layer thickness (in nm) versus number of spin coats applied.

The pyrolysed film-substrate structure is removed from the hot plate and placed in a tube furnace or rapid thermal annealing (RTA) system and post-deposition annealed (Step 480) in an oxygen atmosphere at a temperature high enough, and for a time long enough, to achieve the desired crystallinity of a fully developed paraelectric thin film microstructure. The film-substrate structure is then removed from the tube furnace or RTA and cooled to room temperature.

It must be noted that in each of the embodiments described above, although the films are generally described, preferably, the films contain BST or alternatively are BST-based.

Various modifications and combinations of the illustrative embodiments, as well as other embodiments of the present invention, will be apparent to persons skilled in the art. The embodiments are presented for illustrative purposes only and not in any limiting sense. For example, sputter deposition can be used in place of the pulsed laser deposition technique. Similarly, chemical deposition, such as metalorganic vapor deposition (MOCVD), can be used in place of the example metalorganic solution deposition technique.

We claim:

1. semiconductor material produced by a method comprising the steps of
   (a) providing a substrate comprising SiC; and
   (b) depositing a thin ferroelectric film on the substrate, wherein said depositing comprises heating the substrate to a temperature sufficient to crystallize the film.

2. A semiconductor material comprising:
   a SiC substrate; and
   a ferroelectric film deposited on said substrate,
   wherein at least said substrate is heated to a temperature of at least about 700° C., when said film is deposited thereon, whereby no interfacial phase formations are present at the interface between the substrate and the film.

3. The semiconductor material of claim 2, wherein said ferroelectric film comprises $Ba_{1-x}Sr_xTiO_3$ (BST).

4. A method for producing a semiconductor material, comprising the steps of:
   (a) providing a substrate comprising SiC; and
   (b) depositing a thin ferroelectric film on the substrate, wherein said depositing comprises heating the substrate to a temperature sufficient to crystallize the film.

5. The method of claim 4, wherein the depositing step comprises heating the substrate to a temperature of at least 700° C.

6. The method of claim 4, wherein the depositing step comprises heating the substrate to a temperature of at least 750° C.

7. The method of claim 4, wherein the ferroelectric film comprises $Ba_{1-x}Sr_xTiO_3$ (BST).

8. The method of claim 4, wherein the substrate consists essentially of SiC.

9. The method of claim 8, wherein the ferroelectric film comprises BST.

10. The method of claim 4, wherein said depositing step comprises at least one step selected from the group consisting of physical vapor deposition and chemical deposition.

11. The method of claim 10, wherein said physical vapor deposition comprises one method selected from the group consisting of sputter deposition and pulsed laser deposition.

12. The method of claim 7, wherein the chemical deposition is selected from the group consisting of dip coating, chemical vapor deposition metal-organic decomposition.

13. The method of claim 4, wherein said depositing step comprises performing an annealing treatment, conducted at a temperature in a range from about 700° to about 800° C.

14. The method of claim 4, wherein said depositing is performed to avoid an interfacial phase formation at the interface between the substrate and the film.

* * * * *